United States Patent
Kawam

(10) Patent No.: US 6,555,739 B2
(45) Date of Patent: Apr. 29, 2003

(54) PHOTOVOLTAIC ARRAY AND METHOD OF MANUFACTURING SAME

(75) Inventor: Elias Kawam, Phoenix, AZ (US)

(73) Assignee: Ekla-Tek, LLC, Phoenix, AZ (US)

( * ) Notice: Subject to any disclaimer, the term of this patent is extended or adjusted under 35 U.S.C. 154(b) by 0 days.

(21) Appl. No.: 09/950,310

(22) Filed: Sep. 10, 2001

(65) Prior Publication Data

US 2003/0047206 A1 Mar. 13, 2003

(51) Int. Cl.7 .......................... H01L 31/05; H01L 31/18
(52) U.S. Cl. ..................... 136/244; 136/251; 257/443; 257/448; 438/73; 438/80
(58) Field of Search ................ 136/244, 251; 257/443, 448; 438/73, 80

(56) References Cited

U.S. PATENT DOCUMENTS 3,849,880 A  * 11/1974 Haynos .................. 29/854
4,306,108 A  * 12/1981 Henesian ............... 136/245
5,919,316 A     7/1999 Bogorad et al.
6,420,646 B2 *  7/2002 Benz et al. ............. 136/251
2002/0038663 A1 * 4/2002 Zenko et al. ............ 136/244

FOREIGN PATENT DOCUMENTS

| DE | 39 42 031 C1 |   | 6/1991 |
|----|--------------|---|--------|
| JP | 61-202474 A  |   | 9/1986 |
| JP | 63-278279 A  |   | 11/1988 |
| JP | 9-182314 A   | * | 7/1997 |

* cited by examiner

Primary Examiner—Alan Diamond
(74) Attorney, Agent, or Firm—Quarles & Prady Streich Lang; Paul D. Amrozowicz, Esq.

(57) ABSTRACT

A photovoltaic array includes a plurality of solar cells electrically coupled in series with one another via a plurality of electrically conductive interconnect members and end members. The solar cells and interconnect members are bonded to the array surface of a substrate with double-sided pressure sensitive adhesive, and the interconnect members and end members are electrically coupled to the solar cells via a dry electrical contact. The method of manufacturing the array reduces complexity, time, and costs.

84 Claims, 27 Drawing Sheets

PHOTOVOLTAIC ARRAY AND METHOD OF MANUFACTURING SAME

BACKGROUND OF THE INVENTION

1. Field of the Invention

The present invention relates to photovoltaic arrays and methods of manufacturing photovoltaic arrays. More particularly, the present invention relates a method of manufacturing solar arrays that requires less time and labor efforts and, therefore, reduced costs.

2. Description of Related Art

Many modern systems, both earth borne and space borne, may use photovoltaic (PV) arrays as either a primary or a secondary power source. For example, certain remotely located systems that are not near the electric power grid rely on a PV array to provide a primary or secondary source of power during daylight hours. Additionally, spacecraft and manmade satellites may use PV arrays not only for operation and recharging of systems during non-eclipse periods but also to augment electrically assisted propulsion and station keeping systems.

There are two types of solar cells currently used to make PV arrays. These types are amorphous semiconductors and single crystal semiconductors. Both amorphous and single crystal semiconductors can be, and have been, used in both earth borne and space borne applications. However, driven by the need to keep size and mass to a minimum, space borne applications use single crystal semiconductors, since these provide conversion efficiencies that presently exceed 25% whereas amorphous semiconductors provide efficiencies of approximately 10%.

The semiconductor material used to form single crystal solar cells is first grown as a cylinder. It is then sliced into wafers, polished, and appropriately doped. Individual cells are then cut from the wafer, and a layer of metal is applied to portions of both the top and bottom surfaces of each cell.

Presently, the most common and commercially accepted method for manufacturing a PV array uses as one of the first steps, forming each solar cell into a so-called "Cell-Interconnect-Coverglass," or CIC. To form a CIC, one or more interconnect members made of a thin ribbon of silver or similar metal is either welded or soldered to the solar cell's top surface metal layer. Thereafter, a liquid, translucent silicone adhesive is applied to the solar cell's top surface to bond a layer of doped glass to the cell and interconnect.

After all of the solar cells have been formed into CICs, the CICs are assembled into strings. As part of this assembly process, all of the CICs are placed, one at a time, on an alignment tool or jig, with their glass sides down, interleaving the CICs such that the interconnect member from one CIC is resting on the bottom side of an adjacent CIC. The interconnect members are then attached to the bottom side of adjacent CICs by a soldering and/or a welding process. After a desired number of CICs have been so arranged and attached to form a string, the string is transferred to a substrate, which embodies the final solar array configuration. This transfer process is accomplished by first attaching masking tape or similar non-permanent adhesive to the backside of the string, and transporting the taped string, glass side down, onto a transfer device that is fabricated from a sheet of mylar. The transfer device, fabricated from mylar or similar material, allows the array of modules to be handled and lifted into position.

Thereafter, the surface of the substrate to be laminated with the string of solar cells is primed by painting a silane material on the substrate surface. The backsides of each of the solar cells are also primed with this material to promote subsequent silicone adhesion. A thin layer of liquid silicone adhesive, such as uncured (wet) RTV (room temperature vulcanizing) is then applied to the primed substrate. While the RTV is still wet and uncured, the string is quickly set into place atop the RTV applied to the substrate.

The string is aligned and then, to allow even and sufficient bonding of each solar cell, is either weighted or "bagged" until the RTV cures, which takes approximately seven days. If the string is weighted, individual weights are placed atop each of the cells until the RTV cures. If the string is bagged, the substrate is placed into an airtight bag and a vacuum is drawn in the bag, such that typically a one pound per square inch pressure is uniformly distributed on the string, and is maintained until the RTV cures. After the RTV cures, any excess is removed from the PV array.

The aforementioned process was developed in an effort to create a batch process. As noted, first the CICs are assembled, then strings are assembled, and then the strings are transferred to substrates to form the PV arrays. This manufacturing process results in the handling of the solar cells during at least four separate operations. This results in excessive cost and cycle time. In addition, the process permits only portions of the assembly to be automated. Furthermore, because the solar cells are interconnected by soldering or welding, the inevitable need to replace damaged cells on a completed PV array potentially creates extensive difficulty, increased expense, and schedule delays. Typically, 5% to 8% of the solar cells are damaged during this process, adding to the overall cost. In addition, the present process of manufacturing a PV array suggests that the array be assembled in a central manufacturing facility and then either transported to the place of its end use for installation, or the end use system transported to the manufacturing facility for installation.

Hence, there is a need in the art for a method of manufacturing a PV array that is less labor intensive, and thus less costly, while still meeting the operability requirements for both earth borne and space borne environments. Furthermore, there is a need in the art for a PV array, and a method of manufacturing a PV array, that provides the ability to readily repair and-replace PV array components, as necessary. There is additionally a need in the art for a method of manufacturing a PV array that is not constrained to a centralized manufacturing facility, but that provides for in-situ manufacture at the location of the PV array's end use. There is also a need in the art for a PV array, and a method of manufacturing a PV array, that does not use leaded solar cells.

SUMMARY OF THE INVENTION

The present invention is directed toward overcoming the above-noted problems. Namely, the present invention eliminates the need to solder or weld interconnects to cells. In addition, the present invention eliminates the need to prefabricate CICs or strings, and provides for the ability to readily repair and replace damaged solar cells or other array components. Due to the laminar nature of the manufacturing process of the present invention, automation by a simple pick and place process can be fully utilized to facilitate this invention, as opposed to existing methods, which utilize automation to a limited extent.

In one aspect of the present invention, a method of manufacturing a photovoltaic array includes providing a substrate having an array surface, and individually bonding a plurality of solar cells to the array surface with strips of a first double-sided pressure sensitive adhesive tape. Each of the solar cells comprises a negative terminal portion and a positive terminal portion. A plurality of electrically conductive interconnect members are bonded to the array surface with strips of a second double-sided pressure sensitive adhesive tape. Each of the interconnect members having a first and a second end portion. The first end portion of each interconnect member is electrically coupled to the negative terminal of one of the solar cells and the second end portion of each interconnect member is electrically coupled to the positive terminal of an adjacent solar cell. Thus, the plurality of solar cells are electrically coupled in series with one another.

In another aspect of the present invention, a method of manufacturing a photovoltaic array that includes N solar cells electrically coupled in series, each of the N solar cells having a first polarity terminal and a second polarity terminal, includes the step of providing a substrate including an array surface. A first of the N solar cells is bonded to the array surface with a strip of a first double-sided pressure sensitive adhesive tape. A plurality of electrical interconnect members is provided, each including first and second end portions and an intermediate portion. The first end portion of one of the electrical interconnect members is abutted against the first polarity terminal of the first solar cell and the intermediate portion of the first electrical interconnect member is bonded to the array surface with a strip of a second double-sided pressure sensitive adhesive tape. The second polarity terminal of an additional one of the N solar cells is abutted against the second end portion of the previously bonded electrical interconnect member and is bonded to the array surface with a strip of the first double-sided pressure sensitive adhesive tape. The first end portion of an additional one of the plurality of electrical interconnect members is abutted against the first polarity terminal of the additional one of the N solar cells, and the intermediate portion of this additional interconnect member is bonded to the array surface with a strip of the second double-sided pressure sensitive adhesive tape. The previous two steps are repeated until all N of the solar cells are electrically coupled in series.

In yet another aspect of the present invention, a photovoltaic array includes a substrate, a plurality of solar cells, and a plurality of interconnect members. The substrate includes an array surface. The plurality of solar cells each have a negative electrical terminal and a positive electrical terminal and are individually coupled to the array surface with strips of a first double-sided pressure sensitive adhesive tape. The plurality of electrically conductive interconnect members each have a first end portion and a second end portion and are individually coupled to the array surface with strips of a second double-sided pressure sensitive adhesive tape. The first end portion of each interconnect member is electrically coupled to the positive terminal of one of the solar cells and the second end of each is electrically coupled to the negative terminal of an adjacent solar cell, thereby electrically coupling adjacent solar cells in series with one another.

DETAILED DESCRIPTION OF THE PREFERRED EMBODIMENTS

Figure 1:
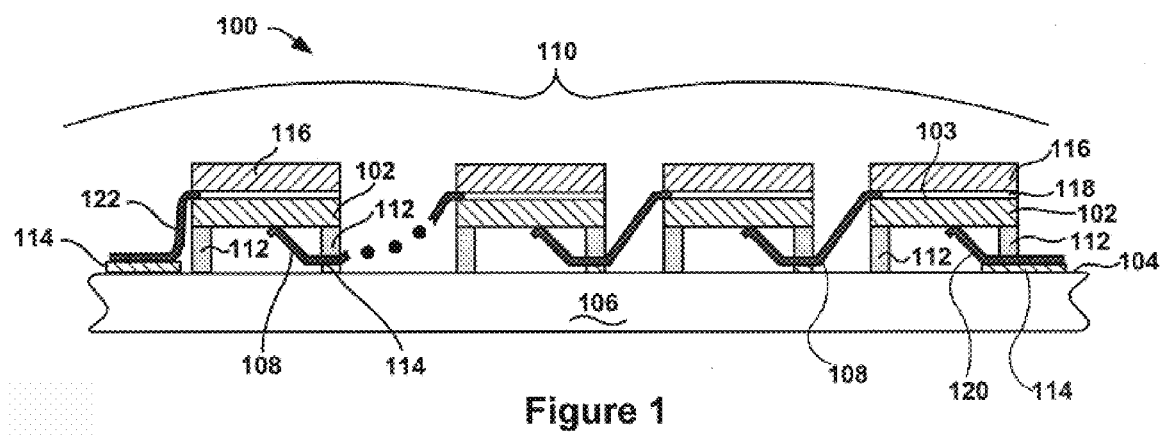
FIG. 1 is a simplified partial schematic side view of an embodiment of a photovoltaic array according to a first embodiment of the present invention.

A simplified side view of a portion of a photovoltaic (PV) array 100 according to a first embodiment of the present invention is depicted in FIG. 1. As depicted therein, the PV array 100 includes a plurality of solar cells 102 bonded to a surface 104 of a substrate 106, and electrically coupled in series with one another, via electrically conductive interconnect members 108, to form a series-connected string 110. It is noted that, for convenience, the substrate surface 104 to which each of the solar cells 102 is bonded is referred to hereinafter as the "array surface."

The substrate 106 onto which each of the components comprising the PV array 100 is mounted may take any desired shape or form and may comprise any one of numerous materials utilized in the art for PV array substrates. For example, the substrate 106 may be a flat panel comprised of aluminum or a graphite epoxy composite. Alternatively, the substrate 106 may have a "honeycomb" configuration, in which its core consists of expanded aluminum material, with a facesheet that comprises any of the previously mentioned materials. In a preferred embodiment, however, the substrate consists of an aluminum honeycomb core, with facesheets comprised of multiple laminated sheets of graphite epoxy composite.

Each of the solar cells 102 is bonded to the array surface 104 with a strip of double-sided pressure sensitive adhesive (PSA) tape 112, as are the interconnect members 108. Additionally, various ones of the series-connected solar cells 102, specifically those solar cells that are not on the "ends" of the series-connected string 110, are also bonded to the electrically conductive interconnect member 108 with a strip of the double-sided PSA tape 114. The term "double-sided" as used herein means that opposite sides of the PSA tapes 112, 114 have a tacky, adhesive property. It is noted that the tape 114 used to bond the interconnect members 108 is, in a preferred embodiment, different than the tape 112 used to bond the solar cells 102 to the array surface 104 and to the interconnect members 108. Specifically, in a preferred embodiment, the PSA tape 112 used to bond the solar cells 102 comprises a silicone tape or equivalent adhesive, whereas the PSA tape 114 used to bond the interconnect members 108 to the array surface 104 comprises an acrylic tape or equivalent adhesive. The skilled artisan will appreciate, however, that a single type of either of the PSA tapes 112, 114 could be used to make the PV array 100.

In addition to the preferred and alternate material make-ups of the double-sided PSA tapes 112, 114, the tapes may take many forms. In a preferred embodiment, however, the tapes 112, 114 are in a so-called "peel-and-stick" form. That is, the tacky sides of the each of the tapes 112, 114 is covered with a material that is readily removable from the tapes 112, 114. Therefore, when a piece of the tape 112, 114 is ready to be used, this layer of material is. "peeled" (or removed) from the tacky side (or sides) and the tape 112, 114 is then placed on the appropriate surface. Thus, the term "peel-and-stick."

As FIG. 1 additionally depicts, each solar cell 102 includes a cover glass 116 bonded over its entire top surface 103 using a substantially transparent silicone adhesive 118. In a preferred embodiment, the cover glass 116 comprises doped silica. However, the skilled artisan will appreciate that other types of materials may also be used, including such non-limiting examples as polycarbonate, plastic, or quartz. Additionally, the silicone adhesive 118 is preferably formed of a translucent silicone adhesive, such as liquid RTV, although other types of materials, including such non-limiting examples as epoxy or pressure sensitive adhesive could also be used.

In addition to the interconnect members 108 that electrically couple the plurality of solar cells 102 in series with one another, each string 110 also includes first and second electrically conductive end members 120, 122. These end members 120, 122 provide for connecting the PV array 100 to external equipment or systems, or to other strings 110 that form the entire PV array 100. Similar to the interconnect members 108, the end members 120, 122 are also bonded to the array surface with strips of double-sided PSA tape 114. Additionally, the first end member 120 is bonded to a solar cell 102 with a strip of double-sided PSA tape 112.

Figure 2:
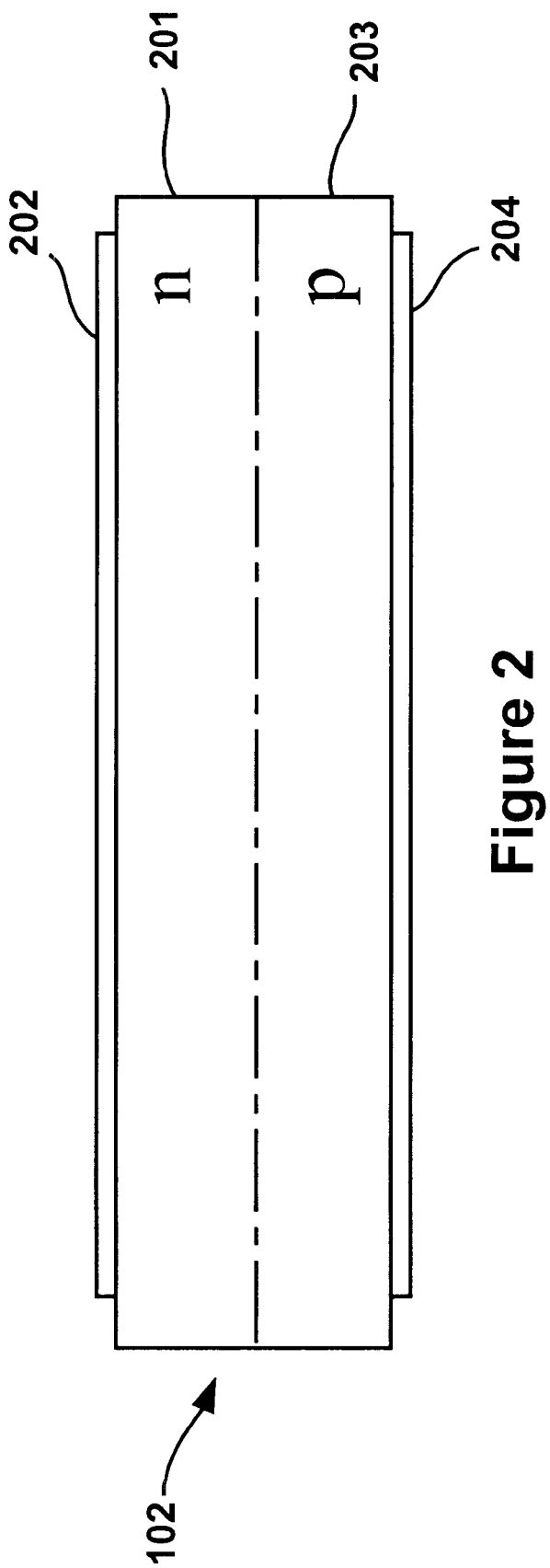
FIG. 2 is a simplified side view of a solar cell used in the array of FIG. 1.

The solar cells 102 that comprise each of the series-connected strings 110 of the PV array 100 may be any one of the conventionally known types of solar cells known in the art. For example, the solar cells 102 may be either the amorphous semiconductor type or the single crystal semiconductor type of solar cell. In a preferred embodiment, however, the solar cells 102 are the single crystal semiconductor type of solar cell, because of the higher efficiency of this type of cell. Specifically, single crystal semiconductor solar cells exhibit conversion efficiencies at or above 25 percent, whereas amorphous semiconductor solar cells currently exhibit efficiencies closer to 10 percent. The solar cells 102 may also be formed into any one of numerous shapes known in the art including, but not limited to, round, square, or rectangular. In a preferred embodiment, the solar cells are preferably rectangular in shape due to packing efficiency and wafer yield optimization. An exemplary embodiment of the solar cells 102 used in the PV array 100 embodiment depicted in FIG. 1 is illustrated in FIG. 2. As illustrated therein, each solar cell 102 comprises an n-type region 201 and an opposing ptype region 203. The n-type region 201 includes a negative terminal 202, and the p-type region 203 includes a positive terminal 204 on an opposite side 205 thereof. It is noted that the physical configuration of the terminals 202, 204 may vary and are not limited to that shown in FIG. 2. Indeed, one specific alternative will be discussed further below when a description of an alternate array configuration and manufacturing method is provided.

Figure 3:
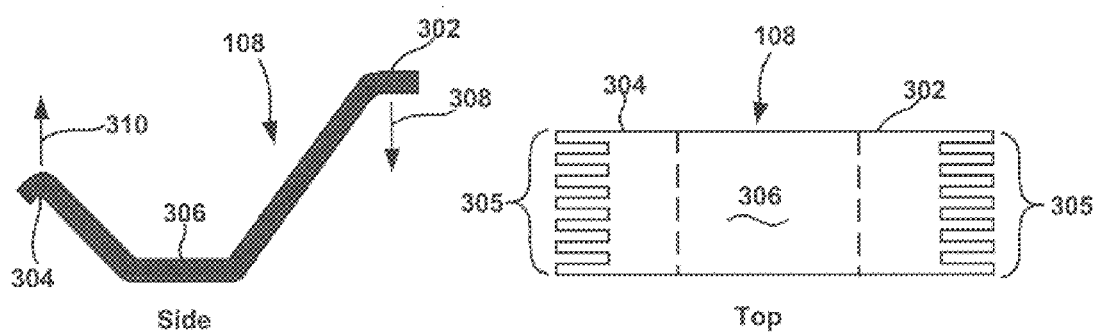
FIG. 3 illustrates a side and top view of an interconnect member used in the array of FIG. 1.
Figure 4:
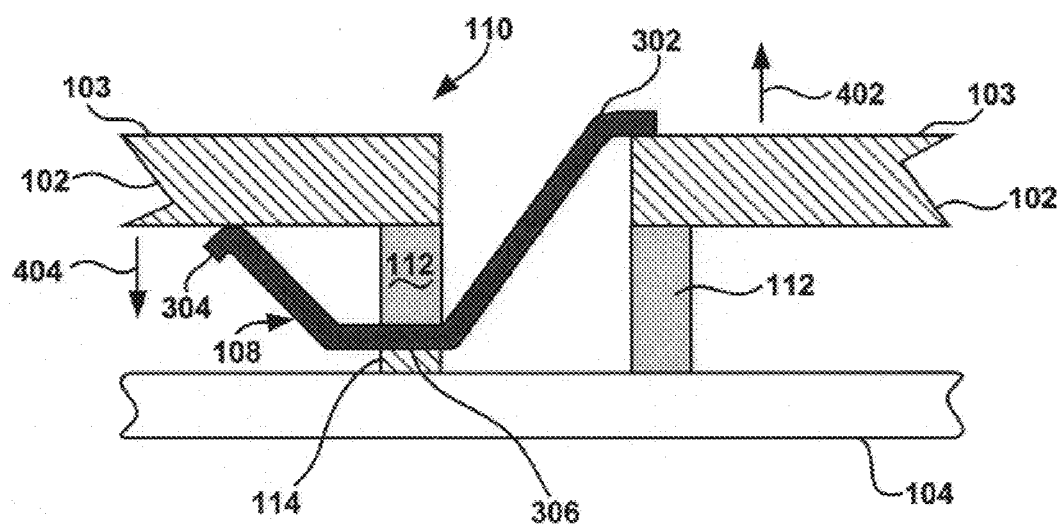
FIG. 4 is a simplified schematic side view of a portion of the array of FIG. 1, depicting the electrical connection between the solar cells.
Figure 5:
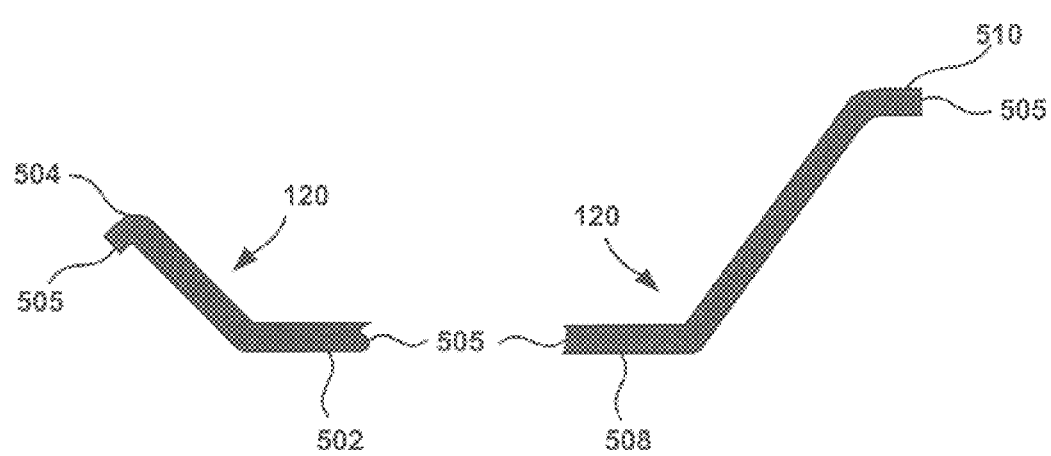
FIG. 5 depicts side views of end members used in the array of FIG. 1.

Turning now to FIGS. 3, 4 and 5, a more detailed description of the interconnect member 108 and the first and second end members 120, 122 will be provided. As FIG. 3 illustrates, the interconnect member 108 comprises first 302 and second 304 end portions, and an intermediate portion 306. Additionally, in the preferred embodiment, each of the end portions 302, 304 includes a plurality of appendages 305. These appendages-305 assist in maintaining sufficient electrical contact between the interconnect member 108 end portions 302, 304 and the negative 202 and positive 204 terminals of the solar cell 102 under varying thermal and mechanical loading scenarios the PV array 100 may encounter.

The interconnect member 108 is formed into a flat spring, such that the first 302 and second 304 end portions are biased in opposite directions. In other words, as shown in FIG. 3, the first end portion 302 is biased in a generally downward direction, as indicated by arrow 308, and the second end portion is biased in a generally upward direction, as indicated by arrow 310. Thus, as indicated in FIG. 4, when the interconnect members 108 are installed in the string 110, the solar cells 102 deflect the first end portions 302 in a generally upward direction 402, and compress the second end portions 304 in a generally downward direction 404. Since the first end portions 302 are biased in the generally downward direction 308 and the second end portions 304 are biased in the generally upward direction 310, physical contact with the negative 202 and positive 204 terminals is maintained without the need for any type of soldering or welding. The interconnect member 108 is designed to deliver a controlled and predictable contact pressure and resistance with the solar cells 102. Thus, a so-called "dry contact," as opposed to the contact provided via soldering or welding, is utilized with the PV arrays 100 of the present invention.

The first and second end members 120, 122 are both depicted in FIG. 5. The first end member 120 includes a generally flat third end portion 502 and a fourth end portion 504 that is biased in the generally upward direction 310. The second end member 122 includes a generally flat fifth end portion 508 and a sixth end portion 510 that is biased in the generally downward direction 308. Both the first and second end members 120, 122 further include a plurality of appendages 505 on the fourth 504 and sixth 510 end portions (though not individually depicted). Thus, when the first and second end members 120, 122 are installed in the string 110, dry contact is made between the end members 120, 122 and the associated solar cell 102.

The interconnect member 108 and the first and second end members 120, 122 are each formed of a thin, high strength conductive material. In a preferred embodiment it is formed from a beryillium-copper (BeCu) alloy. It is appreciated that other materials, such as stainless steel, a super-elastic nickel titanium alloy, or any material known as "shape memory" alloys or metals could also be used. Preferably, each of these members 108, 120, 122 are additionally coated with a thin layer of nickel (Ni), and then plated with a layer of gold (Au). Other materials may be chosen to coat the members; however, Ni and Au are preferable because each exhibits low contact resistance and non-oxidizing, non-corrosion properties.

Figure 6:
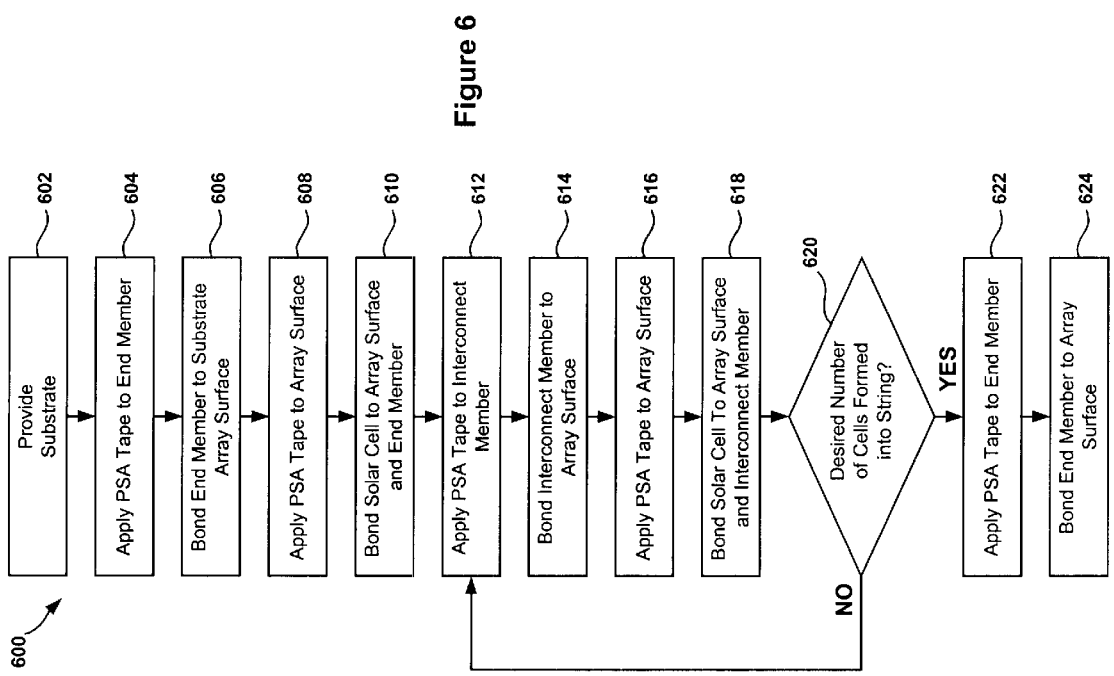
FIG. 6 is a flowchart depicting the methodological flow of a process used to manufacture the array of FIG. 1.

Having described the overall structure of the PV array 100, a description of the method of manufacturing the PV array 100 will now be provided. Throughout the description, reference should be made to FIG. 6 in combination with FIGS. 7–15. It is noted that the parenthetical references within the discussion refer to the variously labeled steps in the flowchart of FIG. 6, and the figure that depicts the step being described. It is further noted that FIG. 6 and concomitant FIGS. 7–15 are only exemplary of a preferred methodological flow for carrying out the method of the present invention, and that various steps may performed in different orders than what is depicted and explicitly described.

Figure 7:
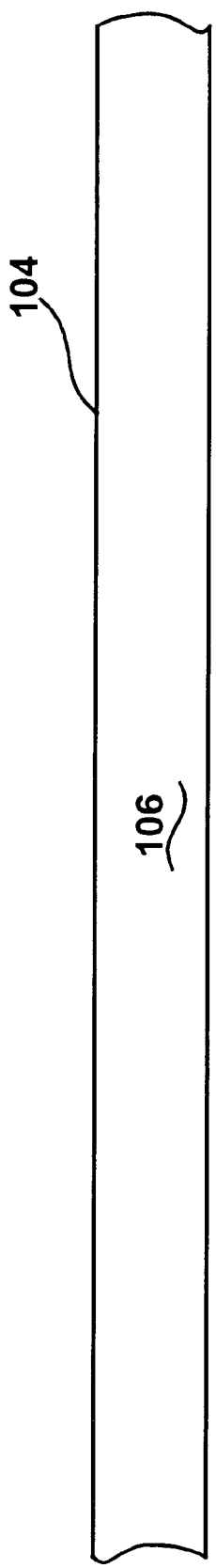
FIGS. 7–15 depict the various stages of the process illustrated in FIG. 6.
Figure 8:
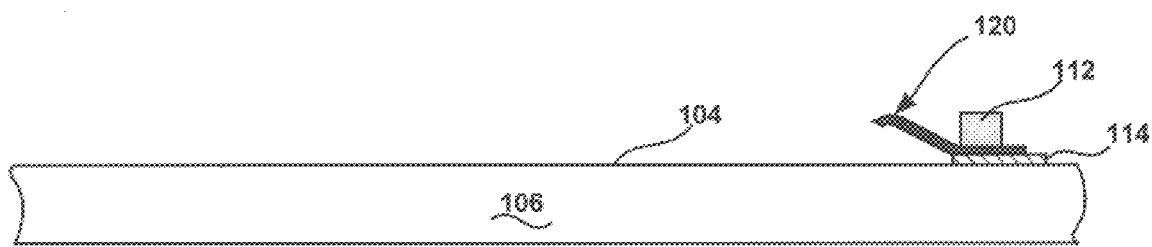

With the above background in mind, the first step of the process 600 is to provide the substrate 106 (STEP 602; FIG. 7). Then, strips of the double-sided PSA tape 112, 114 are peeled and applied to the first end portion of one of the end members 120, 122 (STEP 604), which is then bonded to the substrate array surface 104 (STEP 606; FIG. 8). The skilled artisan will appreciate that either end member 120, 122 may be bonded to the substrate 106 first, although the process depicted in FIGS. 7–15 illustrates the first end member 120 being bonded first. The skilled artisan will additionally appreciate that, as previously mentioned, a single type of either of the double-sided PSA tapes 112, 114 may be used, though both types are preferably used and depicted.

Figure 9:
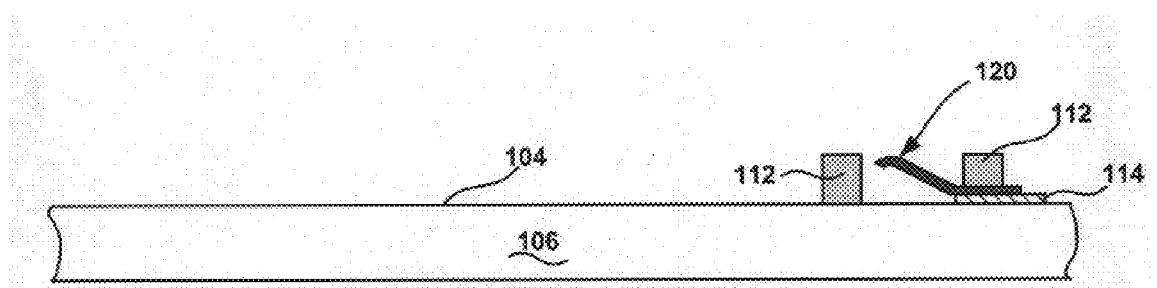
Figure 10:
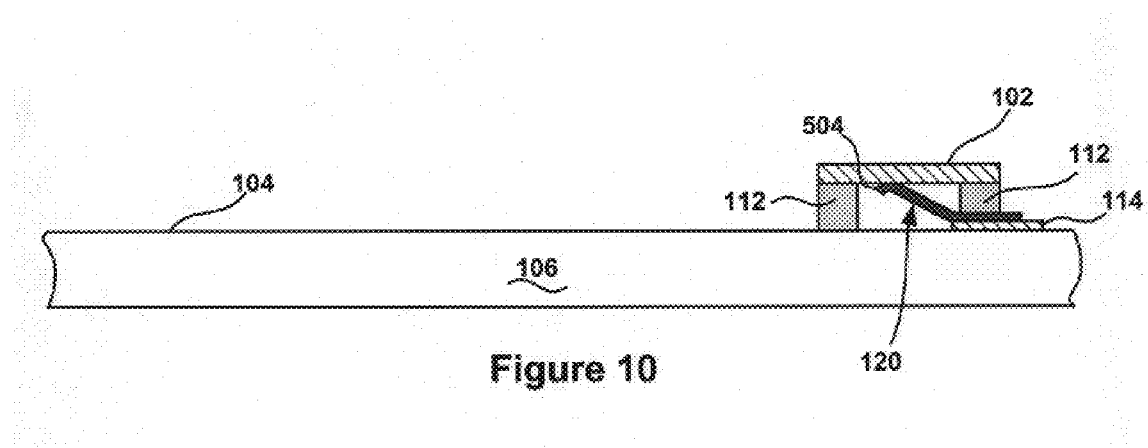
Figure 11:
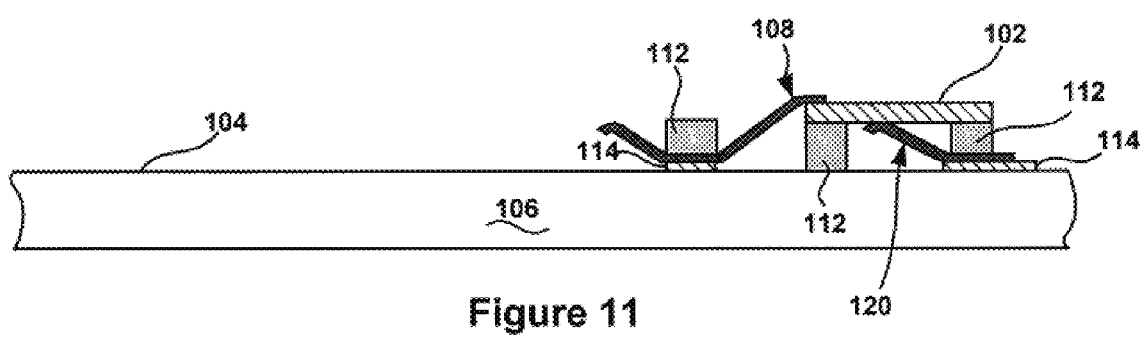
Figure 12:
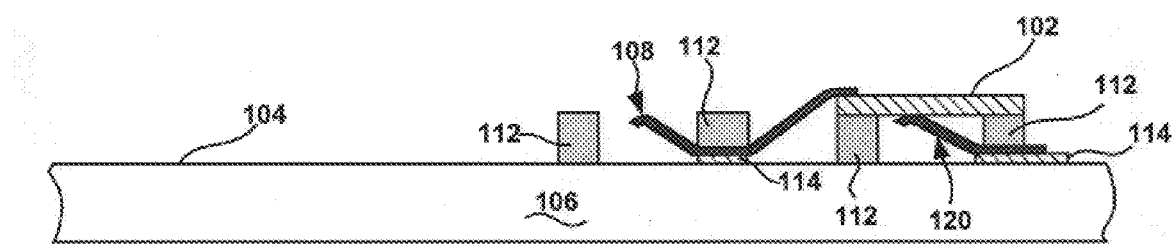
Figure 13:
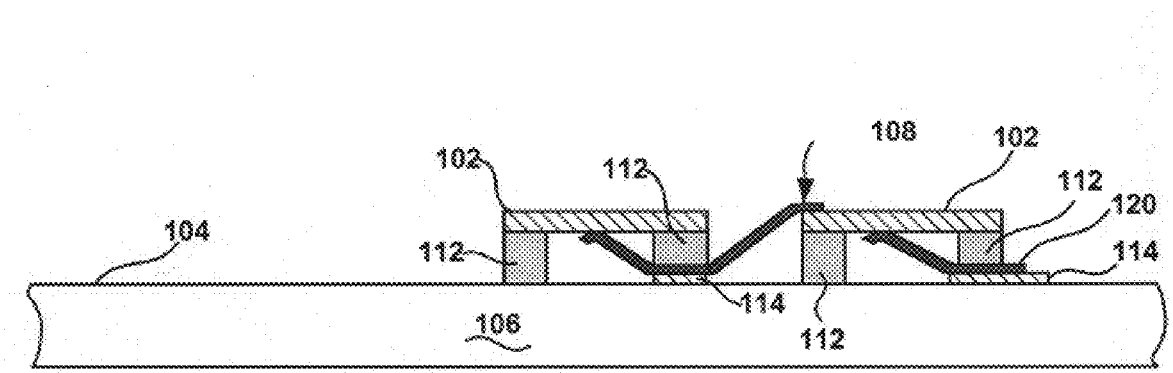

After the first end member 120 is bonded to the array surface 104, a strip of the double-sided PSA tape 112 is applied to the array surface 104 (STEP 608; FIG. 9). A solar cell 102 is then bonded to both the array surface 104 and the first end member 120 via the strips of double-sided PSA tape 112 applied to each (STEP 610; FIG. 10). As was previously described, when the solar cell 102 is bonded to the substrate 104 and first end member 120, the second end portion 504 of the first end member 120 is in dry electrical contact with the positive terminal 204 of the solar cell 102. Strips of the double-sided PSA tape 112, 114 are then peeled and applied to the intermediate portion 306 of one of the interconnect members 108 (STEP 612), which is then bonded to the array surface 104 (STEP 614; FIG. 11). It is noted that, when this step is performed, the first end portion 302 of the interconnect member 108 is placed in dry electrical contact with the negative terminal 202 of the preceding solar cell 102. A strip of the double-sided PSA tape 112 is then applied to the array surface 104 (STEP 616; FIG. 12), and another solar cell 102 is bonded to both the interconnect member 108 and array surface 104 via the strips of the double-sided PSA tape 112 applied to each (STEP 618; FIG. 13). Again, as was previously described, when the solar cell 102 is bonded to the array surface 104 and interconnect member 108, the second end portion 304 of the interconnect member is placed in dry electrical contact with the positive terminal 204 of the just-bonded solar cell 102. Hence, the interconnect member 108 electrically couples the two solar cells 102 in series with one another.

Figure 14:
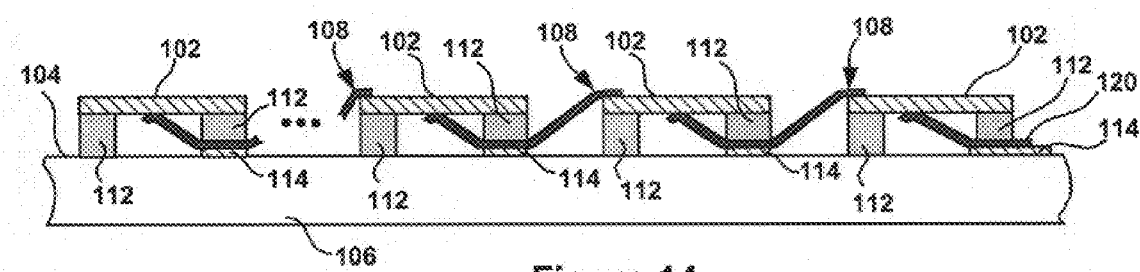
Figure 15:
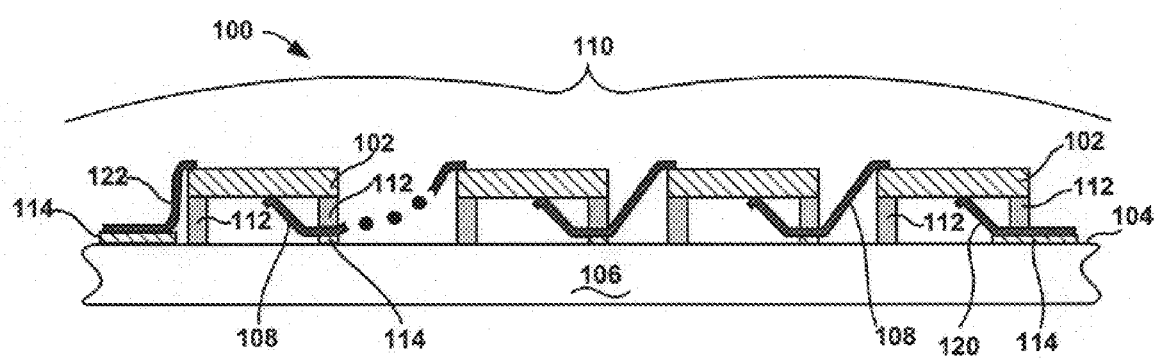

Thereafter, the steps of applying double-sided PSA tape and bonding an interconnect member 108 and solar cell 102 to the array surface 104 are repeated (STEPS 612–618) until the desired number of solar cells 102 are formed into the series-connected string 110 (STEP 620; FIG. 14). Once the string 110 is complete, a strip of the double-sided PSA tape 114 is applied to the second end member 122 (STEP 622), which is then bonded to the array surface 104 with the sixth end portion 510 in electrical contact with the negative terminal 204 of the solar cell 102 (STEP 624; FIG. 15).

Figure 16:
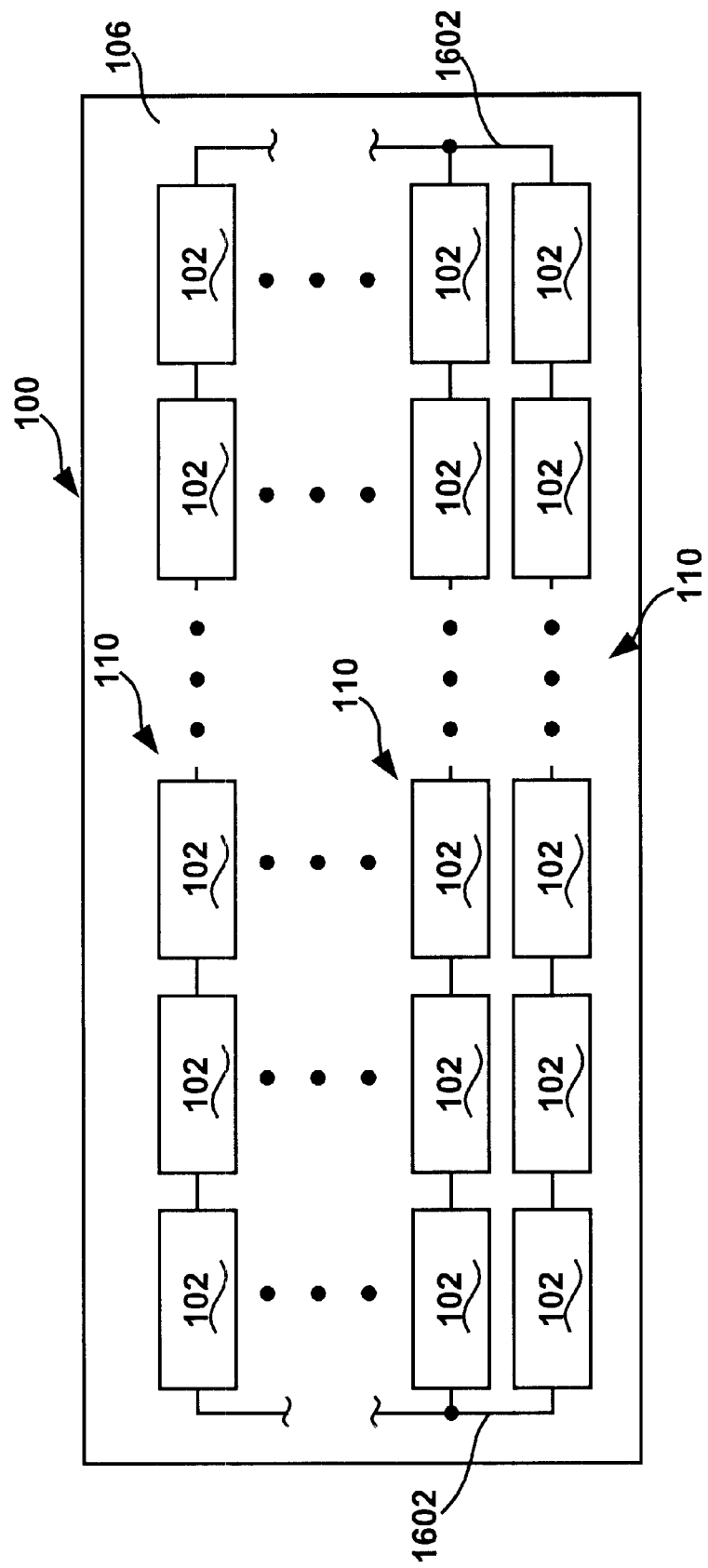
FIG. 16 is a simplified schematic top view of the array illustrated in FIG.

Any desired number of strings 110 can be placed on the array surface 104 using the above-described process 600. These strings 110 are then interconnected in parallel, or series, or various combinations thereof, to meet the design requirements of the system by soldering, welding, crimping, or otherwise electrically attaching conductors 1602 to the first and second end members 120, 122 of each string 110. One or more of these conductors 1602 is used to connect the PV array 100 to external systems and or equipment, neither of which are illustrated herein. A top view of an exemplary configuration, wherein each string 110 is electrically connected in parallel, is depicted in FIG. 16.

Once the desired number of strings 110 is placed on the array surface 104, the PV array 100 is then ready for the next general assembly operation before it is ready to be installed in a system. This next general operation is the so-called "glassing" of each solar cell 102. One of the advantages of the present invention, however, is that it allows for the testing of the PV array 100 prior to glassing each cell 102, if so desired. Such tests include, but are not limited to, spectral and electrical testing of the array 100, as well as any mechanical and thermal testing. For example, as is generally known in the art, PV arrays 100 are tested by placing them in a device that simulates the spectral response of the sun. One such device is known in the art as a "Large-Area-Photo-Sun-Simulator" or LAPSS unit. Nonetheless, no matter which testing device is used, the PV array 100 can be tested prior to the glassing operation, to determine whether any of the solar cells 102 in the PV array 100 are faulty. Thus, time and money may be saved in the event one or more of the solar cells 102 or electrical connections is found faulty.

In any event, once any desired testing of the PV array 100 is satisfactorily completed, each of the solar cells 102 is then "glassed" with the cover glass 116. This is accomplished using one of the many generally known techniques in art. Generally speaking, however, glassing is accomplished by applying the substantially transparent silicone adhesive 118 to each individual solar cell 102, either manually or via an automated application technique, and then placing a cover glass 116 atop the adhesive 118. After glassing, the finished PV array 100, as depicted in FIG. 1, is ready to be installed and used.

It is to be appreciated that the present invention is not limited to the specific order of steps described above. For example, all of the strips of double-sided PSA tape 112, 114 that are used to bond components to the array surface 104 could be applied to the array surface 104 first, rather than to the component. Alternatively, the double-sided PSA tape 112, 114 could be applied to each component ahead of time, and then bonded to the array surface 104, and one another, one at a time. Moreover, the strips of double-sided PSA tape 112, 114 that are used are preferably pre-cut to the desired size prior to commencing the process 500. However, the present invention also encompasses cutting the PSA tape 112, 114 during the process 500.

Figure 17:
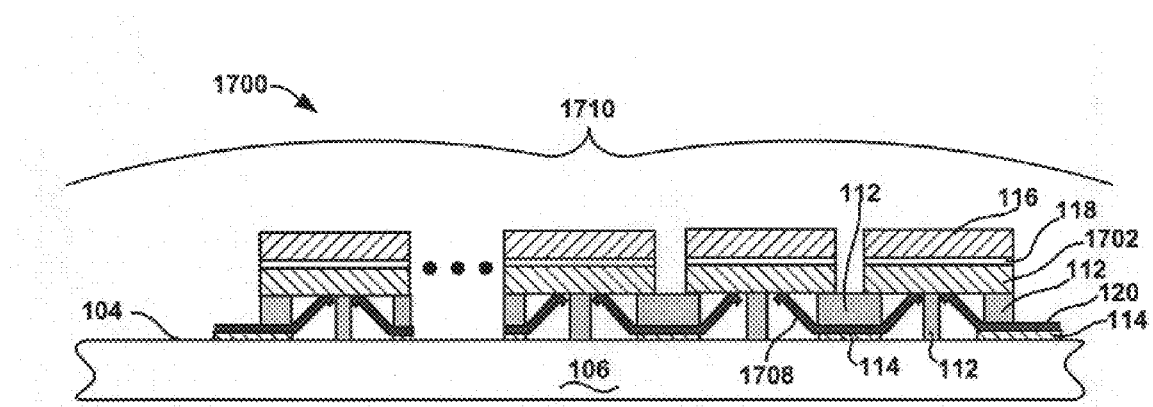
FIG. 17 is a simplified partial schematic side view of an embodiment of a photovoltaic array according to a second embodiment of the present invention.
Figure 18:
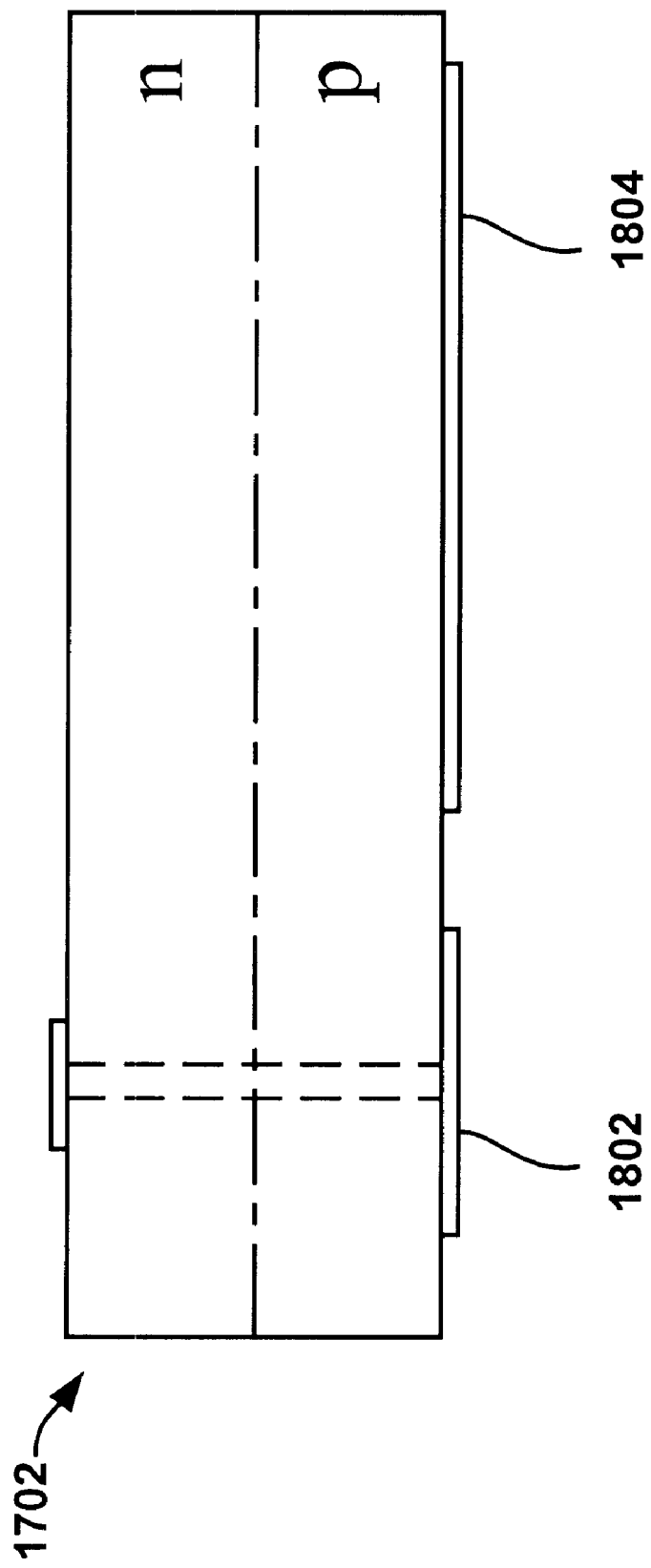
FIG. 18 is a simplified side view of a solar cell used in the array of FIG. 17.

It was previously noted that the present invention encompasses alternatively designed arrays. One such alternative PV array 1700, depicted in FIG. 17, is manufactured using an alternatively designed solar cell 1702. Specifically, as depicted in FIG. 18 the solar cell 1702 used in this alternate PV array configuration 1700 is designed such that both the negative 1802 and positive 1804 terminals are on the same side of the solar cell 1702.

Figure 19:
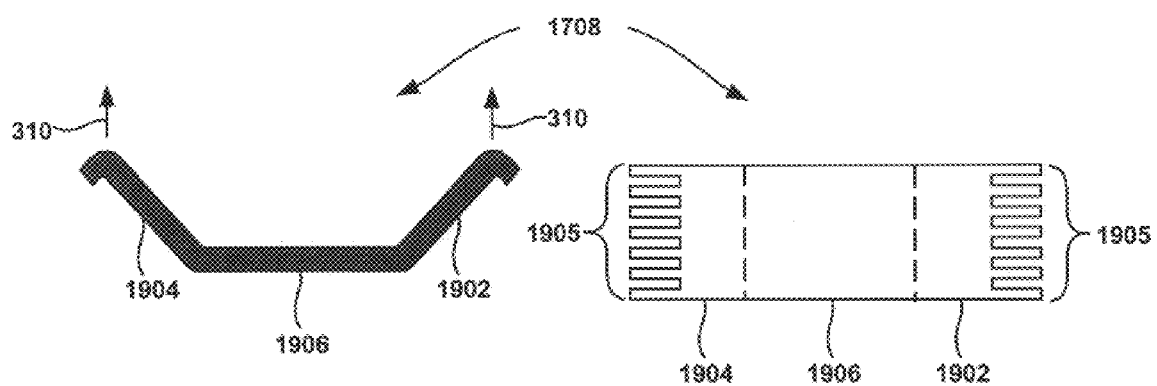
FIG. 19 illustrates a side and top view of an interconnect member used in the array of FIG.17.

When the alternatively designed solar cell 1702 is used, an alternatively configured interconnect member 1708, which is depicted in FIG. 19, is concomitantly used. As depicted, this interconnect member 1708 includes both first 1902 and second 1904 end portions and an intermediate portion 1906, as with the first embodiment 108.

Figure 20:
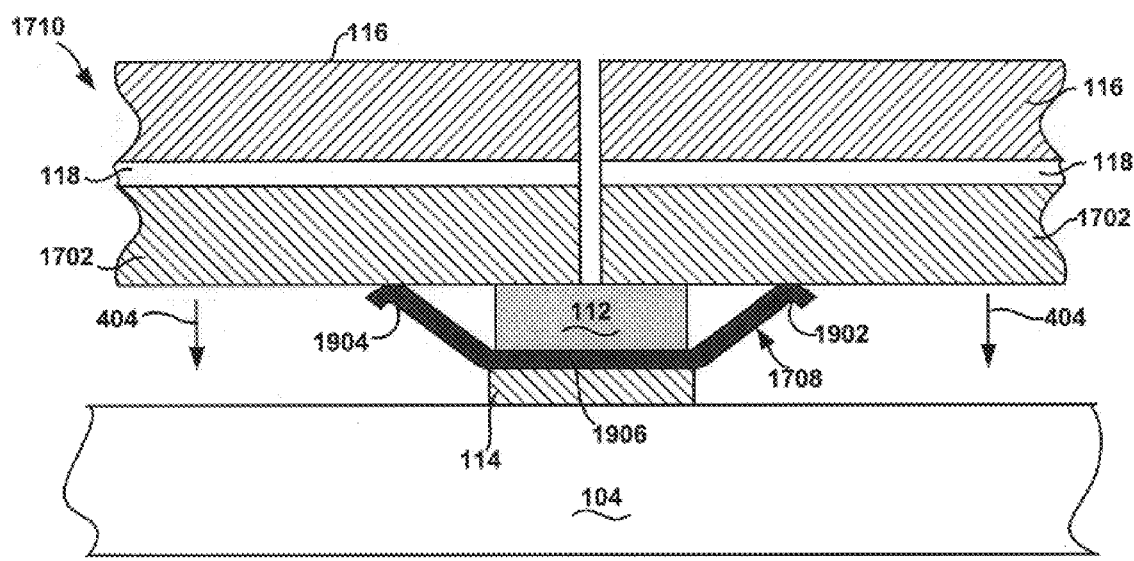
FIG. 20 is a simplified schematic side view of a portion of the array of FIG. 17, depicting the electrical connection between the solar cells.

Additionally, each of the end portions 1902, 1904 each preferably includes a plurality of appendages 1905 to assist in maintaining sufficient electrical contact between the interconnect member 1708 end portions 1902, 1904 and the negative 1802 and positive 1804 solar cell terminals. However, with this alternate interconnect member 1708, both of the end portions 1902, 1904 are biased in the generally upward direction 310. Thus, as indicated in FIG. 20, when the interconnect members 1708 are installed in the string 1710, the solar cells 1702 compress the end portions 1902, 1904 in the generally downward direction 404. Since the end portions 1902, 1904 are biased in the generally upward direction 310, physical contact with negative 1802 and positive 1804 terminals is maintained without having to weld or solder.

When the above-described alternatively designed solar cell 1702 is used, only a single type of end member configuration is use. Specifically, because the solar cells 1702 have the negative 1802 and positive 1804 terminals located on the same side 1803, only the first end member 120 configuration is used.

The alternative PV array 1700 is manufactured using the same process 600 as is used to manufacture the preferred PV array 100 embodiment. Therefore, it will not be further described herein. The skilled artisan will appreciate that the process 600 encompasses not only the process steps explicitly depicted and described, but the various alternatives alluded to herein as well.

Figure 21:
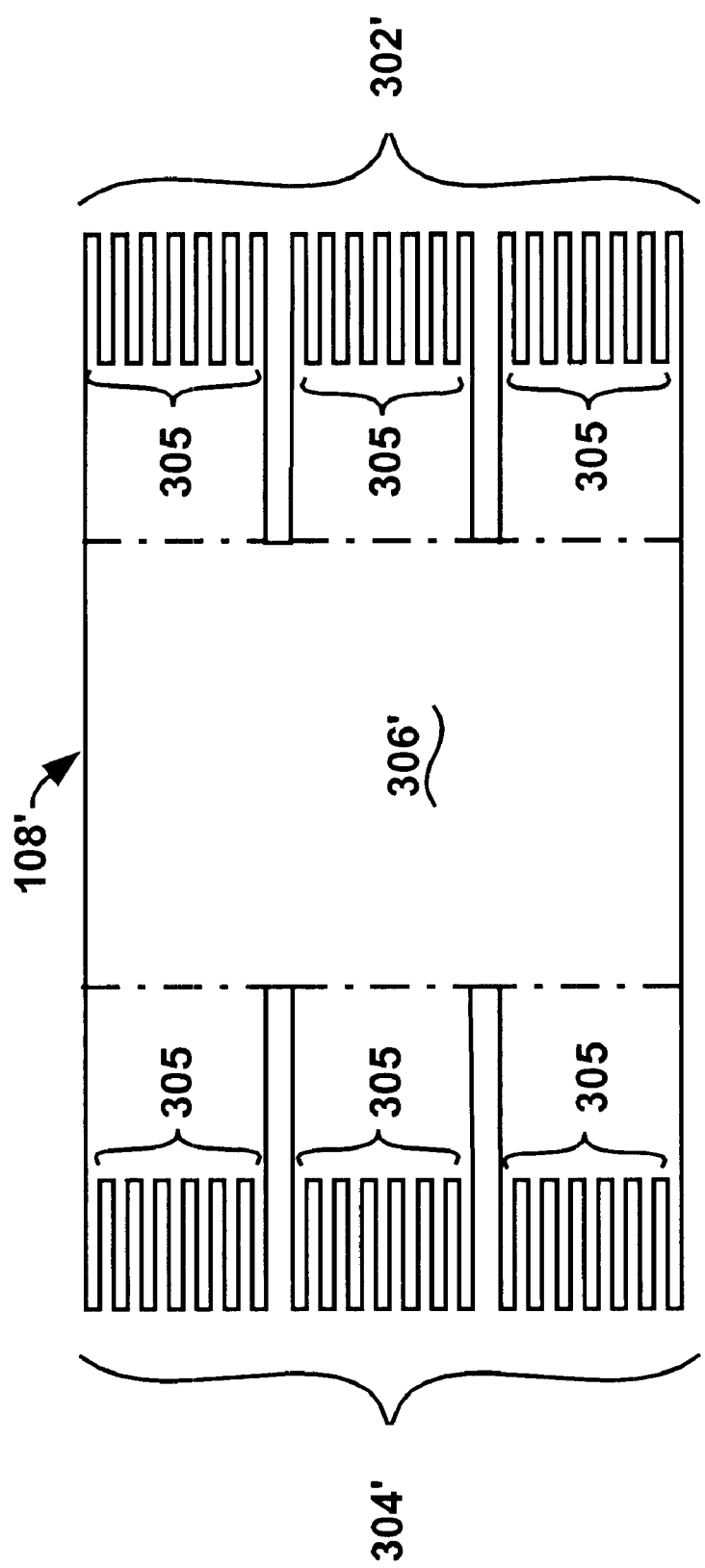
FIG. 21 illustrates a top view of an alternative interconnect member that may be used in the array of FIG. 1.

The arrays and methods of manufacturing the arrays have been, for convenience, depicted and described as comprising strings of series connected solar cells. However, the present invention embodies strings of solar cells that may also be connected in a parallel, or a series-parallel configuration. This is accomplished by providing interconnect members and/or end members having a plurality of end portions. For example, as illustrated in FIG. 21, an alternate interconnect member 108' includes first 302' and second 304' end portions, coupled by an intermediate portion 306', that can be coupled to a plurality of adjacent solar cells to form a parallel electrical connection. Although not explicitly depicted, the skilled artisan will appreciate that this arrangement can be extended to the interconnect member 1708 depicted in FIG. 19, as well as the first and second end members 120, 122. Furthermore, the first 302' and second 304' end portions need not be symmetric.

Moreover, the previously described embodiments are described as using a dry contact between the interconnect members 108, 1708 and end members 120, 122 and the solar cells 102 to provide electrical contact. Turning now to the remaining FIGS. 22–27, various alternative embodiments in which electrical contact to, and between, the solar cells 102 is provided solely by utilizing an electrically conductive adhesive, or a combination of dry contact and electrically conductive adhesive are illustrated.

Figure 22:
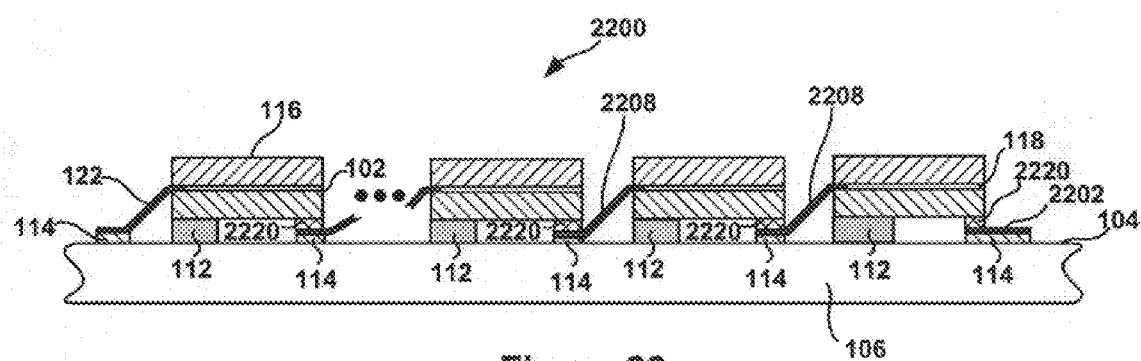
FIGS. 22–27 depict simplified partial schematic side views of photovoltaic arrays according to third through eighth additional embodiments, respectively, of the present invention.
Figure 23:
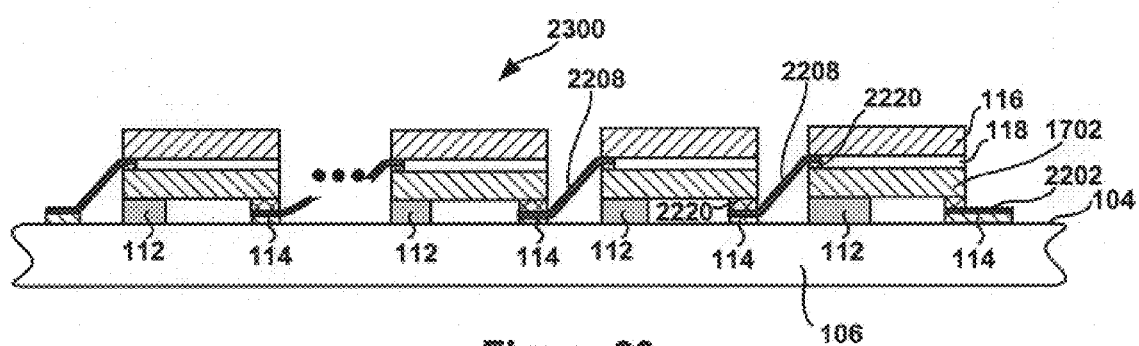
Figure 24:
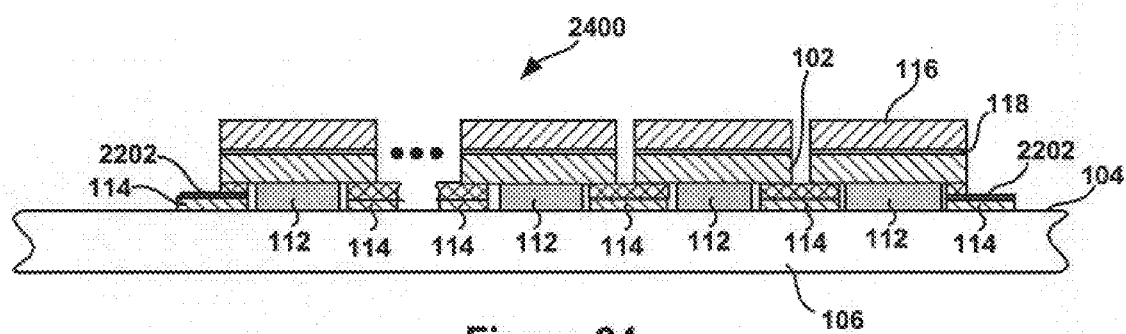
Figure 25:
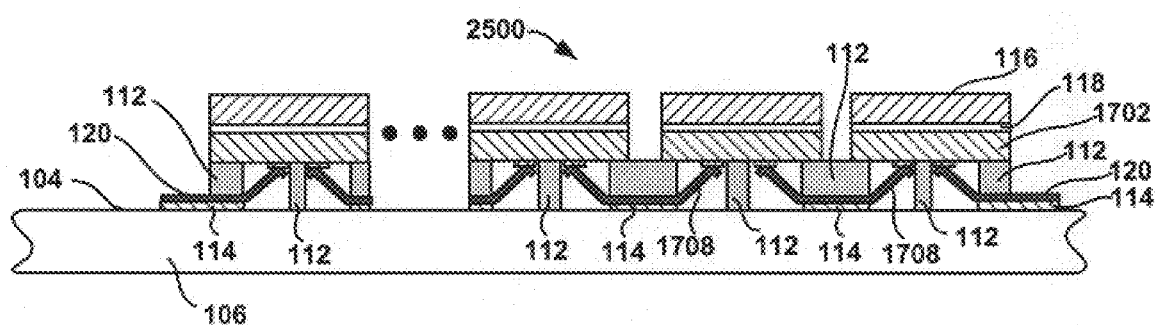
Figure 26:
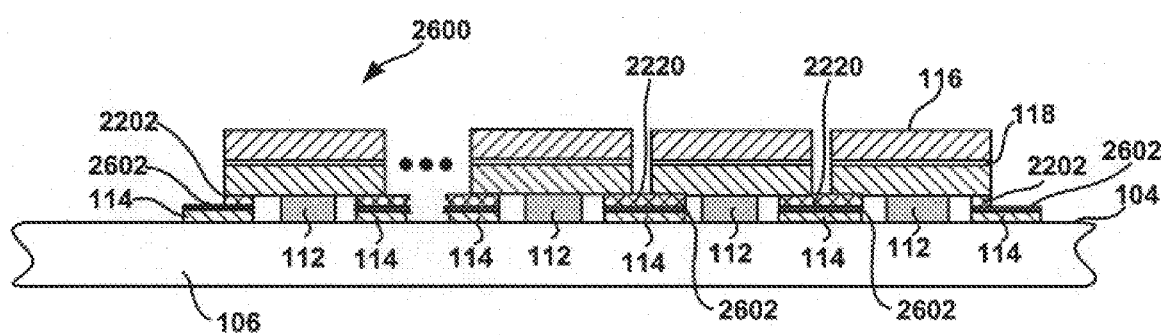
Figure 27:
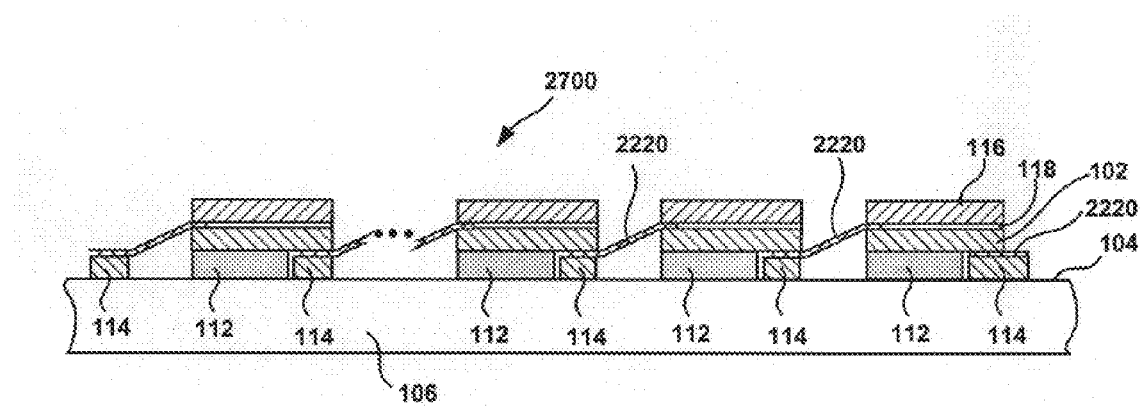

Specifically, and with reference first to FIG. 22, a first alternate PV array 2200 includes a plurality of solar cells 102 bonded to the array surface 104 with a strip of the double-sided PSA tape 112, and interconnected in series, parallel, or series-parallel, as described above, with electrically conductive interconnect members 2208, shaped similar to second end members 122. In this embodiment, however, a first end portion of the interconnect member 2208 is in dry electrical contact with the negative terminal 202 of each solar cell 102, and the second end portion is coupled to the positive terminal 204 with an electrically conductive PSA tape 2220. Additionally, while the array 2200 uses a second end member 122 similar to the embodiment depicted in FIG. 1, it uses a flat first end member 2202, since electrical contact to the positive terminal is provided via the electrically conductive PSA tape 2220. The embodiment depicted in FIG. 23 is similar to that of FIG. 22, except that both ends of the interconnect member 2208 are coupled to adjacent solar cells 102 using the electrically conductive PSA tape 2220. The embodiment depicted in FIG. 24 uses the alternatively designed solar cells 1702 that are depicted in FIG. 18, and the electrically conductive PSA tape 2220 solely as the interconnect member. In addition, both of the end members are flat end members 2202. The embodiment in FIG. 25 is similar to that depicted in FIG. 17, except that the first and second end portions of the interconnect member 1702 are coupled to the solar cells 1702 using the electrically conductive PSA tape 2220. The embodiment depicted in FIG. 26 is similar to that depicted in FIG. 24, except that a conductive strip 2602 is interposed between the electrically conductive PSA tape 2200 and the double-sided PSA tape 114. Finally, the embodiment depicted in FIG. 27 is configured similar to that depicted in FIG. 22, except that the electrically conductive PSA tape 2220 forms the entire interconnect member between adjacent solar cells 102.

Similar to the alternative PV array 1700 of FIG. 17, the alternative PV arrays depicted in FIGS. 22–27 are manufactured using the same process 600 that is used to manufacture the preferred PV array 100 embodiment. Therefore, these processes will not be further described. The skilled artisan will appreciate that the process 600 encompasses not only the process steps explicitly depicted and described, but the various alternatives alluded to herein as well. The skilled artisan will further appreciate the FIG. 22–27 are only exemplary of the numerous alternative configurations encompassed by the present invention.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to any particular embodiment disclosed for carrying out this invention, but that the invention includes all embodiments falling within the scope of the appended claims.

I claim:

1. A method of manufacturing a photovoltaic array, the method comprising:

providing a substrate having an array surface;

individually bonding a plurality of solar cells to the array surface with strips of a first double-sided pressure sensitive adhesive tape, each of the solar cells comprising a negative terminal portion and a positive terminal portion; and individually bonding a plurality of electrically conductive interconnect members to the array surface with strips of a second double-sided pressure sensitive adhesive tape, each of the interconnect members having a first and a second end portion;

wherein the first end portion of each interconnect member is electrically coupled to the negative terminal of one or more of the solar cells and the second end portion of each interconnect member is electrically coupled to the positive terminal of one or more adjacent solar cells, thereby electrically coupling the plurality of solar cells together in a string.

2. The method of claim 1, further comprising:
providing a first electrically conductive end member including a third end portion and a fourth end portion;
providing a second electrically conductive end member including a fifth end portion and a sixth end portion;
individually bonding the third end portion of the first end member to the array surface with a strip of the second double-sided pressure senstive adhesive tape;
electrically coupling the fourth end portion of the first end member to the positive terminal portion of one or more of the plurality of solar cells;
individually bonding the fifth end portion of the second end member to the array surface with a strip of the second double-sided pressure senstive adhesive tape; and
electrically coupling the sixth end portion of the second end member to the negative terminal portion of one or more of the plurality of solar cells.

3. The method of claim 1, wherein:
each interconnect member further includes an intermediate portion between the first and second end portions; and
the intermediate portion of each interconnect member is individually adhered to the array surface with a strip of the second double-sided pressure sensitive adhesive tape.

4. The method of claim 1, further comprising:
individually bonding a plurality of glass members to each of the solar cells.

5. The method of claim 4, further comprising:
testing the photovoltaic array prior to bonding the plurality of glass members to each of the solar cells.

6. The method of claim 1, wherein the first and the second double-sided pressure sensitive adhesive tapes are the same.

7. The method of claim 1, wherein the first double-sided pressure sensitive adhesive tape comprises silicone loaded with a thermally conductive, electrically insulative material.

8. The method of claim 1, wherein the second double-sided pressure sensitive adhesive tape comprises acrylic.

9. The method of claim 1, wherein the second double-sided pressure sensitive adhesive tape comprises silicone.

10. The method of claim 4, wherein the glass members are individually bonded to each of the solar cells with a substantially transparent silicone adhesive.

11. The method of claim 1, further comprising:
pre-cutting each strip of the first and second double-sided pressure sensitive adhesive tape to a size prior to its use.

12. The method of claim 1, further comprising:
pre-cutting a sheet of each of the first and second double-sided pressure sensitive adhesive tapes into a template prior to its use; and
applying the pre-cut templates to the array surface prior to bonding the solar cells and interconnect members.

13. The method of claim 1, wherein at least a portion of the plurality of solar cells are electrically coupled in series.

14. The method of claim 1, wherein at least a portion of the plurality of solar cells are electrically coupled in parallel.

15. The method of claim 1, wherein at least a portion of the plurality of solar cells are electrically coupled in series-parallel.

16. The method of claim 1, wherein the plurality of interconnect members each comprise an electrically conductive metal.

17. The method of claim 16, wherein the electrically conductive metal is a shape-memory metal.

18. The method of claim 1, wherein the plurality of interconnect members each comprise an electrically conductive adhesive.

19. The method of claim 1, wherein the plurality of interconnect members each comprise, in combination, an electrically conductive metal and an electrically conductive adhesive.

20. The method of claim 19, wherein the electrically conductive metal is a shape-memory metal.

21. The method of claim 2, wherein the first and the second end members each comprise an electrically conductive metal.

22. The method of claim 21, wherein the electrically conductive metal is a shape-memory metal.

23. The method of claim 2, wherein the first and the second end members each comprise an electrically conductive adhesive.

24. The method of claim 2, wherein the first and the second end members each comprise, in combination, an electrically conductive metal and an electrically conductive adhesive.

25. The method of claim 24, wherein the electrically conductive metal is a shape-memory metal.

26. The method of claim 1, wherein the first and second end portions of each interconnect member are electrically coupled to the negative and positive terminals, respectively, by a dry contact.

27. A method of manufacturing a photovoltaic array including N solar cells electrically coupled together in a string, each of the N solar cells having a first polarity terminal and a second polarity terminal, the method comprising:
a) providing a substrate including an array surface;
b) bonding a first one or more of the N solar cells to the array surface with a strip of a first double-sided pressure sensitive adhesive tape;
c) providing a plurality of electrical interconnect members each including at least first and second end portions;
d) electrically coupling the first end portion of one of the electrical interconnect members to the first polarity terminal of the first one or more solar cells and bonding the electrical interconnect member to the array surface with a strip of a second double-sided pressure sensitive adhesive tape;
e) electrically coupling the second polarity terminal of an additional one or more of the N solar cells to the second end portion of the previously bonded electrical interconnect member and bonding this additional solar cell to the array surface with a strip of the first double-sided pressure sensitive adhesive tape;
f) electrically coupling the first end portion of an additional one of the plurality of electrical interconnect members to the first polarity terminal of the additional one of the N solar cells; and
g) repeating steps e) and f) until all N of the solar cells are electrically coupled together in a string.

28. The method of claim 27, wherein prior to the step b), the method further comprises:
a1) providing a first electrically conductive end member including a third end portion and a fourth end portion;
a2) individually bonding the third end portion to the array surface with a strip of the second double-sided pressure sensitive adhesive tape; and
a3) electrically coupling the second polarity terminal of the one or more first solar cells to the fourth end portion and bonding the first solar cell to the third end portion with a strip of the first double-sided pressure sensitive adhesive tape.

29. The method of claim 28, further comprising:
  h) providing a second electrically conductive end member including a fifth end portion and a sixth end portion; and
  i) bonding the fifth end portion to the array surface with a strip of the second double-sided pressure sensitive adhesive tape and electrically coupling the sixth end portion against the first polarity terminal of at least the Nth solar cell.

30. The method of claim 29, wherein step i) further comprises bonding at least the Nth solar cell to the fifth end portion with a strip of the first double-sided pressure sensitive adhesive tape.

31. The method of claim 27, further comprising: individually bonding a plurality of glass members to each of the solar cells.

32. The method of claim 31, further comprising:
  testing the photovoltaic array prior to bonding the plurality of glass members to each of the solar cells.

33. The method of claim 27, wherein the first and the second double-sided pressure sensitive adhesive tapes are the same.

34. The method of claim 27, wherein the first double-sided pressure sensitive adhesive tape comprises silicone loaded with a thermally conductive, electrically insulative material.

35. The method of claim 27, wherein the second double-sided pressure senstive adhesive tape comprises acrylic.

36. The method of claim 27, wherein the second double-sided pressure sensitive adhesive tape comprises silicone.

37. The method of claim 31, wherein the glass members are individually bonded to each of the solar cells with a substantially transparent silicone adhesive.

38. The method of claim 27, further comprising:
  pre-cutting each strip of the first and second double-sided pressure sensitive adhesive tape to a size prior to its use.

39. The method of claim 27, further comprising:
  pre-cutting a sheet of each of the first and second double-sided pressure sensitive adhesive tapes into a template prior to its use; and
  applying the pre-cut templates to the array surface prior to bonding the solar cells and interconnect members.

40. The method of claim 27, wherein at least a portion of the N solar cells are electrically coupled in series.

41. The method of claim 27, wherein at least a portion of the N solar cells are electrically coupled in parallel.

42. The method of claim 27, wherein at least a portion of the N solar cells are electrically coupled in series-parallel.

43. The method of claim 27, wherein the plurality of interconnect members each comprise an electrically conductive metal.

44. The method of claim 43, wherein the electrically conductive metal is a shape-memory metal.

45. The method of claim 27, wherein the plurality of interconnect members each comprise an electrically conductive adhesive.

46. The method of claim 27, wherein the plurality of interconnect members each comprise, in combination, an electrically conductive metal and an electrically conductive adhesive.

47. The method of claim 46, wherein the electrically conductive metal is a shape-memory metal.

48. The method of claim 29, wherein the first and the second electrically conductive end members each comprise an electrically conductive metal.

49. The method of claim 48, wherein the electrically conductive metal is a shape-memory metal.

50. The method of claim 29, wherein the first and the second electrically conductive end members each comprise an electrically conductive adhesive.

51. The method of claim 29, wherein the first and the second electrically conductive end members each comprise, in combination, an electrically conductive metal and an electrically conductive adhesive.

52. The method of claim 51, wherein the electrically conductive metal is a shape-memory metal.

53. The method of claim 27, wherein each of the plurality of electrical interconnect members further includes an intermediate portions and wherein each of the plurality of electrical interconnect members is bonded to the array surface via its respective intermediate portion.

54. The method of claim 27, wherein the first and second end portions of each interconnect member are electrically coupled to the first polarity and second polarity terminals, respectively, by a dry contact.

55. A photovoltaic array, comprising:
  a substrate having an array surface;
  a plurality of solar cells individually coupled to the array surface with strips of a first double-sided pressure sensitive adhesive tape, each solar cell having a negative electrical terminal and a positive electrical terminal;
  a plurality of electrically conductive interconnect members individually coupled to the array surface with strips of a second double-sided pressure sensitive adhesive tape, each interconnect member including at least a first end portion and a second end portion,
  wherein the first end portion of each interconnect member is electrically coupled to the positive terminal of one or more of the solar cells and the second end of each interconnect member is electrically coupled to the negative terminal of one or more adjacent solar cells, thereby electrically coupling adjacent solar cells together in a string.

56. The photovoltaic array of claim 55, further comprising:
  a first electrically conductive end member including third and fourth end portions; and
  a second electrically conductive end member including fifth and sixth end portions,
  wherein:
    the third and fifth end portions are individually bonded to the array surface with strips of the second double-sided pressure sensitive adhesive tape;
    the fourth end portion is electrically coupled to the positive terminal of one or more of the plurality of solar cells; and
    the sixth end portion is electrically coupled to the negative terminal of another one or more of the plurality of solar cells.

57. The photovoltaic array of claim 55, wherein:
  each interconnect member further includes an intermediate portion between the first and second end portions; and
  the intermediate portion of each interconnect member is individually coupled to the array surface with strips of the second double-sided pressure sensitive adhesive tape.

58. The photovoltaic array of claim 55, wherein the positive electrical terminal is positioned on a first surface of each solar cell, and the negative electrical terminal is positioned on a second surface of each solar cell, opposite the first surface.

59. The photovoltaic array of claim 55, wherein the positive and negative terminals are positioned on a same surface of each solar cell.

60. The photovoltaic array of claim 55, further comprising:
a plurality of glass members individually bonded one each to the solar cells.

61. The photovoltaic array of claim 55, wherein the first and the second double-sided pressure sensitive adhesive tapes are the same.

62. The photovoltaic array of claim 55, wherein the first double-sided pressure sensitive adhesive tape comprises silicone loaded with a metal oxide.

63. The photovoltaic array of claim 55, wherein the second double-sided pressure sensitive adhesive tape comprises acrylic.

64. The method of claim 55, wherein the second double-sided pressure sensitive adhesive tape comprises silicone.

65. The photovoltaic array of claim 60, wherein the glass members are individually bonded to each of the solar cells with a substantially transparent silicone adhesive.

66. The photovoltaic array of claim 55, wherein each strip of the first and second double-sided pressure sensitive adhesive tape is pre-cut to a size prior to its use.

67. The photovoltaic array of claim 55, wherein a sheet of each of the first and second double-sided pressure sensitive adhesive tapes is pre-cut into templates prior to its use, and applied prior to bonding the solar cells and interconnect members.

68. The photovoltaic array of claim 55, wherein the substrate comprises a material selected from the group consisting of aluminum, and a graphite epoxy composite.

69. The photovoltaic array of claim 55, wherein at least a portion of the plurality of solar cells are electrically coupled in series.

70. The photovoltaic array of claim 55, wherein at least a portion of the plurality of solar cells are electrically coupled in parallel.

71. The photovoltaic array of 55, wherein at least a portion of the plurality of solar cells are electrically coupled in series-parallel.

72. The photovoltaic array of 55, wherein the plurality of interconnect members each comprise an electrically conductive metal.

73. The photovoltaic array of claim 72, wherein the electrically conductive metal is a shape-memory metal.

74. The photovoltaic array of claim 55, wherein the plurality of interconnect members each comprise an electrically conductive adhesive.

75. The photovoltaic array of claim 55, wherein the plurality of interconnect members each comprise, in combination, an electrically conductive metal and an electrically conductive adhesive.

76. The photovoltaic array of claim 75, wherein the electrically conductive metal is a shape-memory metal.

77. The photovoltaic array of claim 56, wherein the first and the second end members each comprise an electrically conductive metal.

78. The photovoltaic array of claim 77, wherein the electrically conductive metal is a shape-memory metal.

79. The photovoltaic array of claim 56, wherein the first and the second end members each comprise an electrically conductive adhesive.

80. The photovoltaic array of claim 56, wherein the first and the second end members each comprise, in combination, an electrically conductive metal and an electrically conductive adhesive.

81. The photovoltaic array of claim 80, wherein the electrically conductive metal is a shape-memory metal.

82. The photovoltaic array of claim 55, wherein the first and second end portions of each interconnect member are electrically coupled to the negative and positive terminals, respectively, by a dry contact.

83. A photovoltaic array, comprising:
a substrate having an array surface;
a plurality of individual solar cells individually coupled to the array surface with strips of a first double-sided pressure sensitive adhesive tape, each solar cell including:
a negative electrical terminal positioned on a first surface; and
a positive electrical terminal positioned on a second surface thereof, opposite the first surface;
a first electrically conductive end member including:
a third end portion bonded to the array surface with a strip of a second double-sided pressure sensitive adhesive tape and to one or more of the plurality of solar cells with a strip of the first double-sided pressure sensitive adhesive tape; and
a fourth end portion electrically coupled to the positive terminal of the one or more solar cells;
a second electrically conductive end member including:
a fifth end portion bonded to the array surface with a strip of the second double-sided pressure sensitive adhesive tape and to an other one or more of the plurality of solar cells with a strip of the first double-sided pressure sensitive adhesive tape; and
a sixth end portion electrically coupled to the negative terminal of the other solar cell; and
a plurality of interconnect members each including:
a first end portion;
a second end portion; and
an intermediate portion;
wherein:
(1) the intermediate portion of each interconnect member is individually coupled to the array surface with a strip of the second double-sided pressure sensitive adhesive tape;
(2) the first end portion of each interconnect member is electrically coupled to the negative terminal of one or more of the solar cells; and
(3) the second end portion of each interconnect member is electrically coupled to the positive terminal of one or more adjacent solar cell, thereby electrically coupling adjacent solar cells together in a string.

84. A photovoltaic array, comprising:
a substrate having an array surface;
a plurality of individual solar cells individually coupled to the array surface with strips of a first double-sided pressure sensitive adhesive tape, each solar cell including a negative electrical terminal and a positive electrical terminal positioned on a same surface thereof;
a first electrically conductive end member including:
a third end portion bonded to the array surface with a strip of a second double-sided pressure sensitive adhesive tape and to one or more of the plurality of solar cells with a strip of the first double-sided pressure sensitive adhesive tape; and
a fourth end portion electrically coupled to the positive terminal of the one or more solar cells;

a second electrically conductive end member including:
   a fifth end portion bonded to the array surface with a strip of the second double-sided pressure sensitive adhesive tape and to an other one of the plurality of solar cells with a strip of the first double-sided pressure sensitive adhesive tape; and
   a sixth end portion electrically coupled to the negative terminal of the other solar cell;
and
a plurality of interconnect members each including:
   a first end portion;
   a second end portion; and
   an intermediate portion;
wherein:

(1) the intermediate portion of each interconnect member is individually coupled to the array surface with a strip of the second double-sided pressure sensitive adhesive tape;
(2) the first end portion of each interconnect member is electrically coupled to the negative terminal of one or more of the solar cells; and
(3) the second end portion of each interconnect member is electrically coupled to the positive terminal of one or more adjacent solar cells, thereby electrically coupling adjacent solar cells together in a string.

* * * * *